United States Patent
Quemerais et al.

(10) Patent No.: US 8,963,559 B2
(45) Date of Patent: Feb. 24, 2015

(54) VARIABLE IMPEDANCE DEVICE

(75) Inventors: Thomas Quemerais, Chirens (FR); Daniel Gloria, Detrier (FR); Romain Debroucke, Le Sappey en Chartreuse (FR)

(73) Assignees: STMicroelectronics (Crolles 2) SAS, Crolles (FR); STMicorelectronics SA, Montrogue (FR)

( * ) Notice: Subject to any disclaimer, the term of this patent is extended or adjusted under 35 U.S.C. 154(b) by 90 days.

(21) Appl. No.: 13/601,904

(22) Filed: Aug. 31, 2012

(65) Prior Publication Data

US 2013/0099797 A1    Apr. 25, 2013

(30) Foreign Application Priority Data

Oct. 24, 2011    (FR) ...................................... 11 59605

(51) Int. Cl.
| | | |
|---|---|---|
| G01R 29/26 | (2006.01) | |
| H03F 3/193 | (2006.01) | |
| H03F 1/56 | (2006.01) | |
| H03F 3/60 | (2006.01) | |
| G01R 27/04 | (2006.01) | |
| G01R 27/32 | (2006.01) | |
| G01R 31/26 | (2014.01) | |

(52) U.S. Cl.
CPC .............. *H03F 3/193* (2013.01); *H03F 1/565* (2013.01); *H03F 3/601* (2013.01); *G01R 31/2626* (2013.01); *H03F 2200/294* (2013.01); *H03F 2200/378* (2013.01); *H03F 2200/381* (2013.01); *H03F 2200/387* (2013.01); *H03F 2200/423* (2013.01)
USPC ........................... 324/614; 324/637; 324/641

(58) Field of Classification Search
CPC ... H04B 1/1036; H04H 40/18; H04N 5/4446; H04N 5/50; G01R 31/2626; H03F 1/565; H03F 2200/294
USPC .......... 324/614, 367, 641, 637; 333/28 R, 33, 333/81, 109, 204
See application file for complete search history.

(56) References Cited

U.S. PATENT DOCUMENTS

| | | | | |
|---|---|---|---|---|
| 5,363,069 | A * | 11/1994 | Sadhir et al. | ................. 333/28 R |
| 5,373,152 | A * | 12/1994 | Domon et al. | .......... 250/214 AG |
| 5,933,264 | A * | 8/1999 | Van Der Heijden | .......... 398/202 |
| 6,268,735 | B1 * | 7/2001 | Craig et al. | ................... 324/603 |
| 6,271,726 | B1 * | 8/2001 | Fransis et al. | ................. 330/254 |
| 7,282,926 | B1 * | 10/2007 | Verspecht et al. | ............. 324/637 |

(Continued)

FOREIGN PATENT DOCUMENTS

| | | |
|---|---|---|
| JP | 2008271112 A | 11/2008 |
| WO | WO 00/35086 | 6/2000 |

(Continued)

OTHER PUBLICATIONS

Maxim, "Three Methods of Noise Figure Measurement", www.maxim-ic.com/legal, Nov. 21, 2003, 7 pages.

*Primary Examiner* — Tung X Nguyen
*Assistant Examiner* — Raul Rios Russo
(74) *Attorney, Agent, or Firm* — Slater & Matsil, L.L.P.

(57) ABSTRACT

A variable impedance device includes a passive tuner that includes at least one variable component, which is controllable to apply a variable impedance value to an input signal of the passive tuner. A low noise amplifier is configured to supply the input signal to the passive tuner by amplifying an input RF (radio frequency) signal.

30 Claims, 2 Drawing Sheets

(56) References Cited

U.S. PATENT DOCUMENTS

| | | | |
|---|---|---|---|
| 7,414,493 B1* | 8/2008 | Hussain et al. | 333/116 |
| 7,834,704 B2* | 11/2010 | Hijikata et al. | 330/305 |
| 2002/0097107 A1* | 7/2002 | Burns et al. | 333/26 |
| 2006/0067840 A1 | 3/2006 | Kawakubo et al. | |
| 2006/0279275 A1* | 12/2006 | Simpson | 324/158.1 |
| 2008/0290947 A1 | 11/2008 | Dawe | |
| 2008/0297172 A1* | 12/2008 | Held | 324/614 |
| 2009/0009250 A1 | 1/2009 | Satoh et al. | |
| 2009/0261903 A1* | 10/2009 | Touzard et al. | 330/254 |
| 2010/0289583 A1* | 11/2010 | Touzard et al. | 330/254 |
| 2011/0102007 A1* | 5/2011 | Ghadaksaz | 324/755.02 |
| 2011/0316631 A1* | 12/2011 | Rafi | 330/277 |

FOREIGN PATENT DOCUMENTS

| | | |
|---|---|---|
| WO | WO 2004/073160 A2 | 8/2004 |
| WO | WO 2006/047294 A1 | 5/2006 |

\* cited by examiner

VARIABLE IMPEDANCE DEVICE

CROSS-REFERENCE TO RELATED APPLICATIONS

This application claims the priority benefit of French patent application number 1159605, filed on Oct. 24, 2011, which is hereby incorporated by reference to the maximum extent allowable by law.

TECHNICAL FIELD

The present invention relates to a variable impedance device, and, in particular embodiments, to a variable impedance device comprising a passive tuner.

BACKGROUND

Variable impedance devices are used in a variety of applications. For example, they can be used in RF instrumentation, to test certain devices such as transistors under a range of load conditions, and thereby provide device characterization.

Such variable impedance devices are generally off-chip devices having a passive tuner network comprising components such as variable capacitors, variable inductors and variable resistors in order to provide variable impedance.

Certain applications such as 60 GHz WLAN (wireless local area networks), wireless HDMI (high definition multimedia interface), wireless USB (universal serial bus) and 77 GHz automotive radars require active devices capable of high performance at relatively high frequencies of 60 GHz or over.

However, a drawback of existing variable impedance devices is that they tend to be relatively costly and/or they are not adapted to such high frequency ranges.

SUMMARY OF THE INVENTION

According to one aspect, a variable impedance device comprises a passive tuner comprising at least one variable component controllable to apply a variable impedance value to an input signal of the passive tuner. A low noise amplifier is configured to supply the input signal to the passive tuner by amplifying an input RF (radio frequency) signal.

According to one embodiment, the LNA comprises a transistor having a gate terminal coupled to receive the RF input signal, and first and second main current terminals. The first main current terminal is coupled to an output node of the LNA. An inductive element is coupled between the second main current terminal of the transistor and a ground node.

According to another embodiment, the inductive element is formed by a waveguide.

According to another embodiment, the inductive element in a degenerative SELF inductance.

According to another embodiment, the LNA further comprises a first impedance matching circuit coupled between an input node of the LNA and the gate terminal of the transistor, and a second impedance matching circuit coupled between the first main current terminal of the transistor and the output node.

According to another embodiment, the first impedance matching circuit comprises a first waveguide coupled between the input node and an intermediate node, and a second waveguide coupled between the intermediate node and a ground node.

According to another embodiment, the at least one variable component comprises either a variable resistor or a variable capacitor or a variable inductor or any combination of the above.

According to another embodiment, the variable impedance device further comprises a control block adapted to control the at least one variable component based on a selection signal indicating an output impedance value to be programmed.

According to another embodiment, the passive tuner comprises a variable resistor, a variable capacitor, and an inductor of fixed inductance.

According to a further aspect, an integrated circuit comprises the above variable impedance device. A device under test is coupled to an output of the variable impedance device. A noise extraction block is coupled to receive an output signal of the device under test and is configured to determine the noise figure and/or noise factor of the device under test.

According to one embodiment, the integrated circuit comprises the above variable impedance device, wherein the noise extraction block is further adapted to generate the selection signal.

According to a further aspect, there is provided an RF probe comprising the above variable impedance device.

According to a further aspect, a system for device characterization comprises an integrated circuit including a device under test. The above RF probe is configured to be coupled to the integrated circuit to supply the RF input signal at the plurality of impedance values to at least one input of the device under test. A further RF probe is configured to be coupled to the integrated circuit to receive an output signal from the device under test.

According to one embodiment, the system further comprises noise extraction circuitry coupled to the further RF probe and configured to determine, based on the output signal, the noise figure and/or noise factor of the device under test.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

DETAILED DESCRIPTION OF ILLUSTRATIVE EMBODIMENTS

Throughout the following description, some components are described as "waveguides." As will be apparent to those skilled in the art, the waveguides described herein are adapted to the transmission of RF electro-magnetic signals, and, for example, have a characteristic impedance value determined by their dimensions. Examples of types of waveguides include transmission lines and micro-strips. Other devices described as resistors, capacitors and/or inductors can be assumed to be localized components adapted to perform the corresponding function.

Furthermore, throughout the following description, the term "coupled" is used generally to cover both a direct connection between two elements and a connection between two elements via another component, such as a transistor, resistor, capacitor, waveguide or the like.

Figure 1:
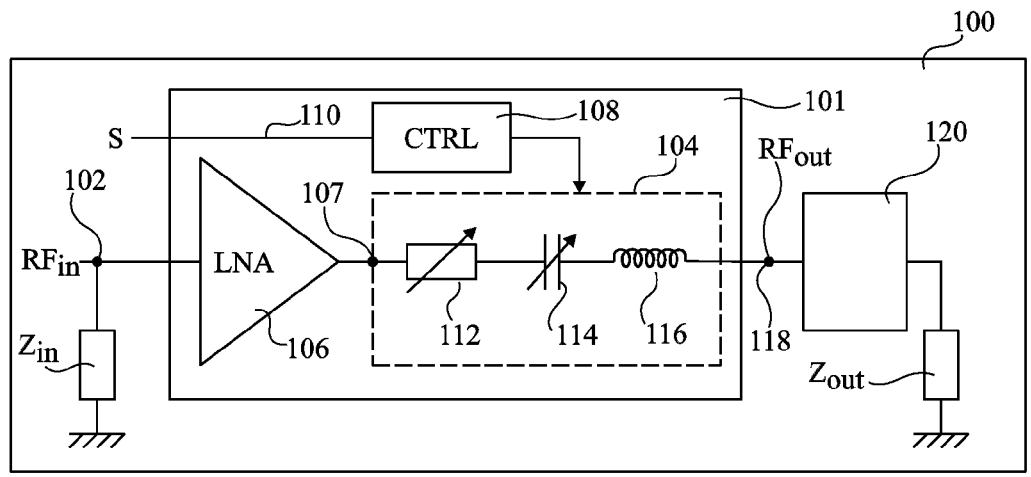
FIG. 1 illustrates a variable impedance device according to one embodiment.

FIG. 1 illustrates an integrated circuit 100 comprising a variable impedance device 101.

Variable impedance device 101 comprises an input node 102 receiving an RF (radio frequency) input signal $RF_{in}$, for example having a frequency of between 60 and 110 GHz, although higher or lower frequency signals may be supplied. An input impedance $Z_{in}$ determines the input impedance of the input node 102, which is for example of 50 ohms, although other values are possible.

The input node 102 is coupled to a passive tuner 104, via a low noise amplifier (LNA) 106. In the example of FIG. 1, the passive tuner 104 comprises an input node 107 coupled to a variable resistor 112, a variable capacitor 114 and an inductor 116 of fixed inductance, all coupled in series. More generally, the passive tuner for example comprises one or more variable components such as variable resistors, variable capacitors and/or variable inductors, for providing variable impedance.

The variable components of the passive tuner 104 are controlled by one or more control signals provided by a control block (CTRL) 108, which generates the control signals based on a selection signal S on an input line 110. For example the selection signal S is a digital signal indicating a desired impedance of the tuner, in the form a+jb, where a and b are the real and imaginary parts of the tuner output impedance respectively.

An output line 118 from the passive tuner 104 provides an output signal $RF_{out}$, which may for example be used to test or drive a circuit block 120, as will be explained in more detail below. An output of circuit block 120 is coupled to ground via an impedance $Z_{out}$, which represents the output impedance of the circuit block 120, which is for example the same as the input impedance $Z_{in}$ of the input node 102, or a different value.

Thus, the variable impedance device 101 allows a range of input impedances to be applied at the input of circuit block 120. For example, this permits circuit block 120 to be tested over a relatively large range of input impedances.

Figure 2:
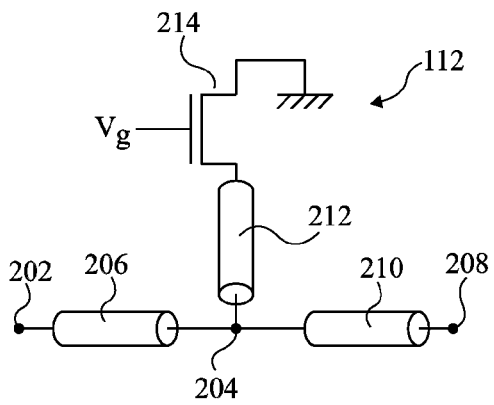
FIG. 2 illustrates an example of a variable resistor of a passive tuner of the device of FIG. 1.

FIG. 2 illustrates the variable resistor 112 of FIG. 1 in more detail according to one example. An input node 202 of the variable resistor 112 is coupled to an intermediate node 204 via a waveguide 206, and node 204 is in turn coupled to an output node 208 of the variable resistor 112 via a further waveguide 210. The intermediate node 204 is further coupled to a ground node via a waveguide 212 and an N-channel MOS transistor 214 connected in series. The gate node of transistor 214 is controlled by a control voltage $V_g$.

In operation, the waveguides 206, 210 and 212, which are for example implemented by transmission lines, have widths chosen to provide appropriate resistances, and the level of control voltage $V_g$, for example in a range of −1.5 to 1.5 V, determines the equivalent resistance of the device.

As an alternative, in certain applications the variable resistor could be implemented by a resistance network with a plurality of resistive branches, each branch being activated by a corresponding switch, as will be apparent to those skilled in the art.

Figure 3:
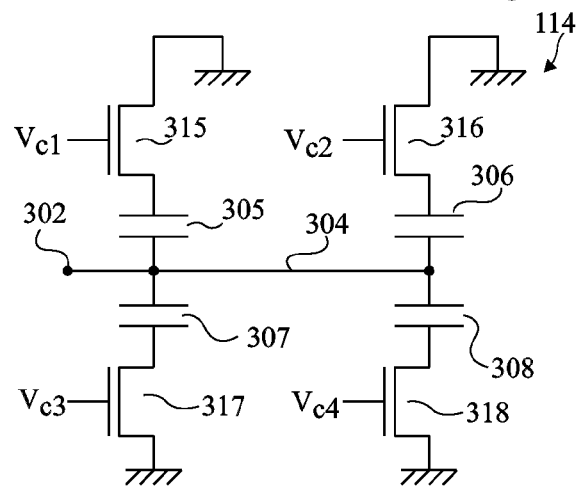
FIG. 3 illustrates an example of a variable capacitor of the passive tuner of FIG. 1.

FIG. 3 illustrates the variable capacitor 114 of FIG. 1 in more detail according to one example, in which the capacitor is a digitally tuned capacitance (DTC).

The variable capacitor 114 comprises an input node 302 coupled to a line 304. Four capacitors 305 to 308 formed in respective branches each have one of their terminals coupled to line 304. The other terminal of each capacitor 305 to 308 is coupled to ground via corresponding transistors 315 to 318, respectively. Capacitors 305 to 308 are for example MOM (metal oxide metal) capacitors, although other types of capacitors could be used.

Transistors 315 to 318 are controlled at their gate notes by control voltages $V_{c1}$ to $V_{c4}$, respectively. The control voltages are used to activate or deactivate the corresponding capacitor branch. Thus, the control voltages $V_{c1}$ to $V_{c4}$ can be used to activate none, one, two, three or all four of the capacitor branches, causing line 304 to have a capacitance equal to the value of just one of the capacitors, or the sum of two, three or all four of the capacitors. The capacitances of each of the capacitors 315 to 318 may be the same, or each capacitor could have a different capacitance, allowing a broader range of capacitance values to be achieved.

Naturally, the number of capacitor branches coupled to the line 304 could be different, four branches being only one example.

Figure 4:
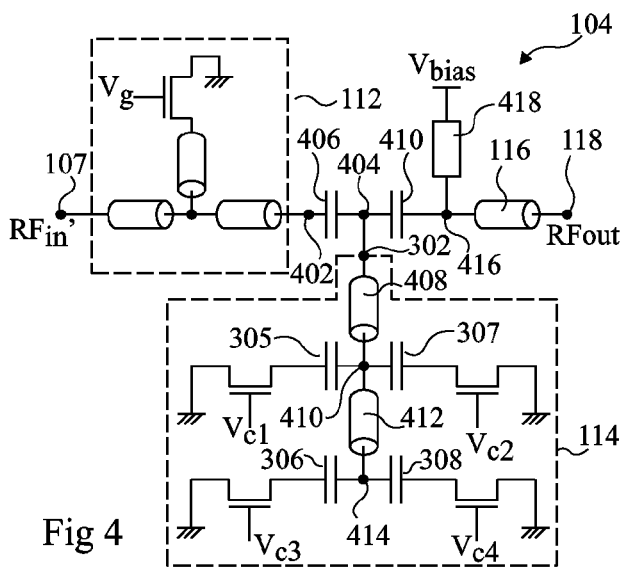
FIG. 4 illustrates the passive tuner of FIG. 1 in more detail according to one embodiment.

FIG. 4 illustrates the passive tuner 104 of FIG. 1 in more detail according to one particular example.

The input node 107 receives an input signal $RF_{in}'$, which corresponds to the input signal $RF_{in}$ after amplification by the LNA 106. Input node 107 is coupled to the variable resistance 112 of FIG. 2, the output of which is coupled to a node 402. Node 402 is in turn coupled to a node 404 via a capacitor 406. Node 404 is coupled to the variable capacitance 114 of FIG. 3, which in this example comprises a waveguide 408 coupled between the input node 302 and a node 410 connected to capacitors 305, 307, and a waveguide 412 coupled between node 410 and a node 414 connected to capacitors 306, 308. The node 404 is also coupled to a node 416 via a capacitor 410. Capacitors 406 and 410 for example form transmission capacitances. Node 416 is in turn coupled to a biasing voltage $V_{bias}$ via a resistor 418 having a relatively high resistance value. Node 416 is further coupled to the output node 118 via the fixed inductance 116, which is for example implemented by a micro-strip or SELF inductor.

In operation, the control voltages $V_{c1}$ to $V_{c4}$ and $V_g$ are applied to select a desired output impedance of the passive tuner 104.

Figure 5:
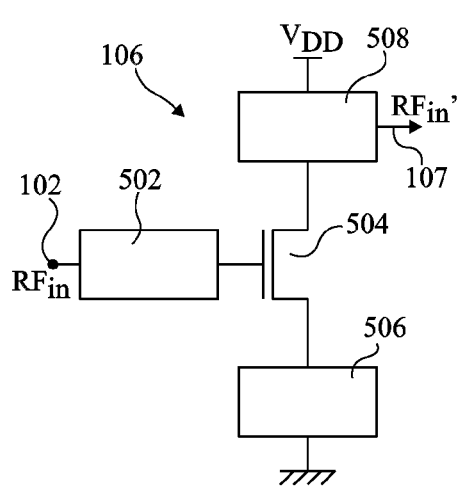
FIG. 5 illustrates a low noise amplifier of FIG. 1 according to one example.

FIG. 5 schematically illustrates the principal components of the low noise amplifier 106 of FIG. 1 according to one example.

The input node 102 is for example coupled by a circuit block 502 to the gate node of an N-channel transistor 504. Transistor 504 is coupled via an inductive element 506 to ground, and via a circuit block 508 to the supply voltage $V_{DD}$. An output of circuit block 508 is coupled to the input node 107 of the passive tuner 104, and provides the RF signal $RF_{in}'$.

The circuit blocks 502 and 508, as an example, provide impedance matching of the input and output terminals 102, 107, respectively, of the LNA. The inductance element 506 is for example a degenerative inductor that provides additional impedance matching of the input node 102 as well as improved frequency band matching, as will be described in more detail with reference to FIG. 6.

Figure 6:
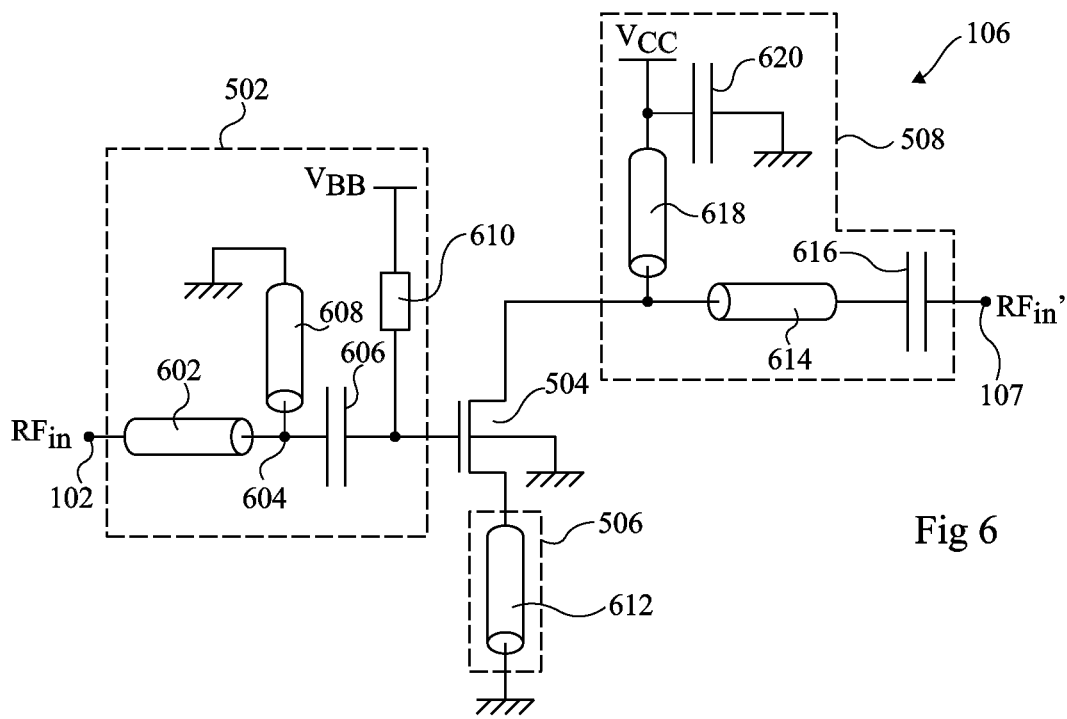
FIG. 6 illustrates the low noise amplifier of FIG. 5 in more detail according to one example.

FIG. 6 illustrates the LNA of FIG. 5 in more detail according to one example.

The circuit block 502 for example comprises a waveguide 602 coupled between the input node 102 and an intermediate node 604, and a capacitor 606 coupled between node 604 and the gate node of transistor 504. Node 604 is further coupled via a waveguide 608 to ground. The gate node of transistor 504 is also coupled to a supply voltage $V_{BB}$ via a resistor 610.

The inductive element 506, as an example, comprises a waveguide 612, which is adapted to perform the role of a degenerative self inductor, and is, for example, implemented by a micro-strip. For example, the inductance of waveguide 612 is in the range 1 to 10 pH, although other values may be possible depending on the desired input impedance of the input node 102. Such a degenerative self also tends to expand the frequency band matching of the LNA.

The circuit block 508 comprises a waveguide 614 and a capacitor 616 coupled in series between the drain terminal of transistor 504 and node 107. The drain terminal of transistor 504 is also coupled via a waveguide 618 to a supply voltage $V_{CC}$. The voltages $V_{BB}$ and $V_{CC}$ are biasing voltages for biasing the nodes of the transistor 504. A capacitor 620 is for example coupled between $V_{CC}$ and ground, and, for example, has a capacitance of 500 fF or more in order to provide RF/DC decoupling.

Figure 7:
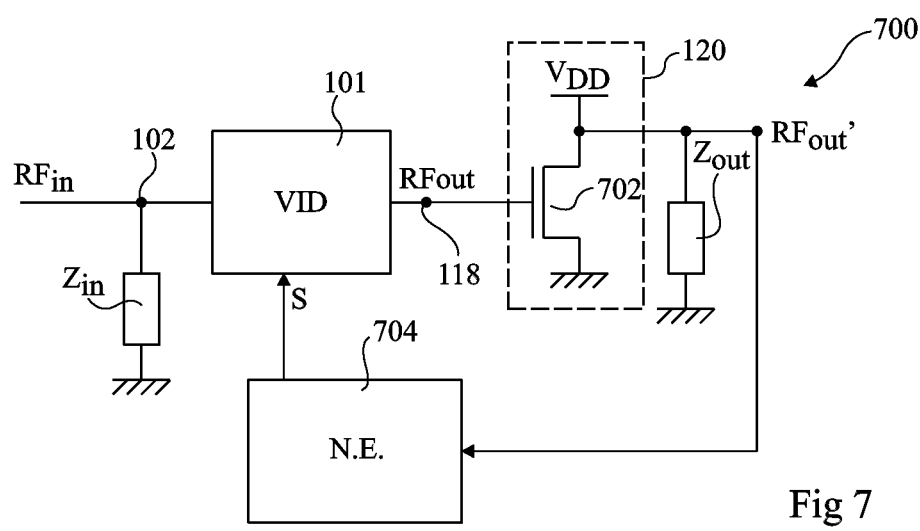
FIG. 7 illustrates an integrated circuit comprising a variable impedance tuner according to one embodiment.

FIG. 7 illustrates an example application of the variable impedance device 101 of FIG. 1. An integrated circuit 700 comprises the variable impedance device 101 having its input node 102 receiving the input RF signal $RF_{in}$, and at its output line 118 the output RF signal $RF_{out}$. In this example, the circuit block 120 is a device under test comprising an N-channel transistor 702, the gate node of which is coupled to line 118. Transistor 702 is biased by a supply voltage $V_{DD}$.

A noise extraction block 704 receives the RF output signal $RF_{out}'$ from the device under test 120, and provides a control signal S to the variable impedance device 101 to program its impedance value. The noise extraction block 704, for example, measures at least the noise figure (NF) and/or noise factor (F) associated with transistor 702 for a given frequency as a function of the output impedance of the variable impedance device 101. For example, three methods of measuring the noise figure or noise factor, known as the "Gain method", "Y-factor method" and "Noise Figure Meter method", are discussed in more detail in the publication entitled "Three methods of Noise Figure Measurement," Nov. 21, 2003 (Application Note 2875) available online at address http://www.maxim-ic.com/app-notes/index.mvp/id/2875.

Figure 8:
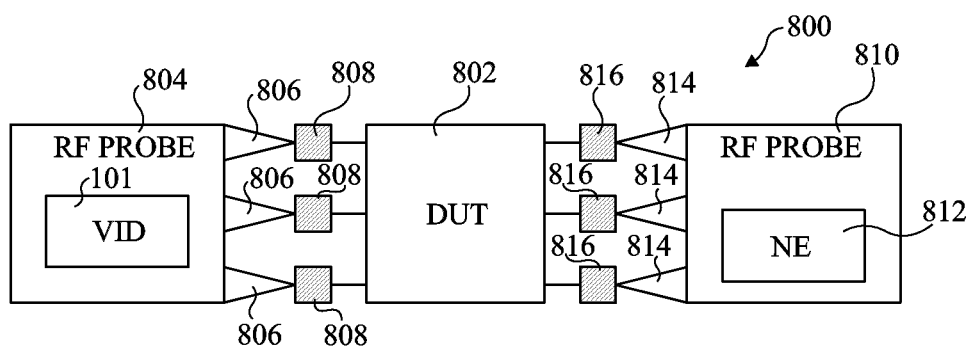
FIG. 8 illustrates a test system comprising variable impedance RF (radio frequency) probes.

FIG. 8 illustrates another example application of the variable impedance device 101 of FIG. 1. A system 800 comprises a device under test (DUT) 802, which is on an integrated circuit and, for example, comprises one or more components to be tested. An RF probe 804 is separate from the device under test 802. The RF probe 804 comprises the variable impedance device 101 and a number of test pins 806 (in this example three), which are adapted to be coupled to corresponding input connection pads 808 of the integrated circuit 802. A further RF probe 810 monitors the output of the device under test 802, and comprises a noise extraction block (NE) 812. In particular, the RF probe 810 comprises test pins 814 adapted to be coupled to corresponding pads 816 of the device under test 802.

In operation, the noise extraction block 812, for example, measures, based on an output signal of the device under test, at least the noise figure (NF) and/or noise factor (F) of the device under test 802.

An advantage of the embodiments described herein is that, by providing a low noise amplifier at the input of a passive tuner of a variable impedance device, the device can provide high performance over a large range of relatively high frequencies, and in particular, at frequencies of between 60 GHz and 110 GHz.

Having thus described at least one illustrative embodiment, various alterations, modifications and improvements will readily occur to those skilled in the art.

For example, it will be apparent to those skilled in the art that the N-channel MOS transistors described herein could be replaced by P-channel devices, or by transistors formed using other technologies such as bipolar or HBT (Heterojunction bipolar transistor) technology.

Furthermore, the various features described herein could be combined in alternative embodiments in any combination.

Such alterations, modifications and improvements are intended to be within the scope of the invention. Accordingly, the foregoing description is by way of example only and is not intended to be limiting. The invention is limited only as defined in the following claims and the equivalent thereto.

What is claimed is:

1. A variable impedance device comprising:
    an RF input node;
    an RF output node;
    a passive tuner comprising a variable resistor and a variable capacitor, wherein the variable resistor and the variable capacitor are coupled in series between the RF input node and the RF output node and wherein the passive tuner is controllable to apply a variable impedance value to an input signal of the passive tuner at the RF input node; and
    a low noise amplifier coupled between the RF input node and the passive tuner and configured to supply the input signal to the passive tuner by amplifying an input radio frequency (RF) signal, the low noise amplifier comprising:
        a transistor having a gate terminal coupled to receive the input RF signal, and first and second main current terminals, the first main current terminal being coupled to an output node of the low noise amplifier, wherein the passive tuner is coupled to the output node; and
        a second impedance matching circuit coupled between the first main current terminal of the transistor and the output node;
    wherein the passive tuner and the low noise amplifier are formed on a single integrated circuit.

2. The variable impedance device of claim 1, wherein the low noise amplifier further comprises an inductive element coupled between the second main current terminal of the transistor and a ground node.

3. The variable impedance device of claim 2, wherein the inductive element is formed by a waveguide.

4. The variable impedance device of claim 2, wherein the inductive element is a degenerative SELF inductance.

5. The variable impedance device of claim 1, wherein the low noise amplifier further comprises a first impedance matching circuit coupled between an input node of the low noise amplifier and the gate terminal of the transistor.

6. The variable impedance device of claim 5, wherein the first impedance matching circuit comprises a first waveguide coupled between the input node and an intermediate node and a second waveguide coupled between the intermediate node and a ground node.

7. The variable impedance device of claim 1, wherein the passive tuner further comprises a variable inductor.

8. The variable impedance device of claim 1, further comprising a control block configured to control the at least one variable component based on a selection signal that indicates an output impedance value to be programmed.

9. The variable impedance device of claim 1, wherein the passive tuner further comprises an inductor of fixed inductance.

10. An integrated circuit comprising:
a variable impedance device comprising
a passive tuner comprising at least one variable component controllable to apply a variable impedance value to an input signal of the passive tuner, and
a low noise amplifier configured to supply the input signal to the passive tuner by amplifying an input radio frequency (RF) signal, and
a control block configured to control the at least one variable component based on a selection signal that indicates an output impedance value to be programmed;
a device under test coupled to an output of the variable impedance device; and
a noise extraction block coupled to receive an output signal of the device under test and configured to determine a noise figure and/or noise factor of the device under test, and wherein the noise extraction block is further configured to generate the selection signal.

11. The integrated circuit of claim 10, wherein the low noise amplifier comprises:
a transistor having a gate terminal coupled to receive the RF input signal, and first and second main current terminals, the first main current terminal being coupled to an output node of the low noise amplifier; and
an inductive element coupled between the second main current terminal of the transistor and a ground node.

12. The integrated circuit of claim 11, wherein the low noise amplifier further comprises:
a first impedance matching circuit coupled between an input node of the low noise amplifier and the gate terminal of the transistor; and
a second impedance matching circuit coupled between the first main current terminal of the transistor and the output node.

13. The integrated circuit of claim 10, wherein the at least one variable component comprises a variable resistor and/or a variable capacitor and/or a variable inductor, or any combination of the above.

14. The integrated circuit of claim 10, wherein the variable impedance further comprises a control block configured to control the at least one variable component based on a selection signal that indicates an output impedance value to be programmed.

15. The integrated circuit of claim 10, wherein the passive tuner comprises a variable resistor, a variable capacitor, and an inductor of fixed inductance.

16. An RF probe comprising:
a variable impedance device comprising
a passive tuner comprising at least one variable component controllable to apply a variable impedance value to an input signal of the passive tuner, wherein the passive tuner is configured to apply the variable impedance value for signals having a frequency between 60 and 110 GHz, and
a low noise amplifier configured to supply the input signal to the passive tuner by amplifying an input radio frequency (RF) signal; and
a plurality of probe pins coupled to the variable impedance device.

17. The RF probe of claim 16, wherein the low noise amplifier comprises:
a transistor having a gate terminal coupled to receive the RF input signal, and first and second main current terminals, the first main current terminal being coupled to an output node of the low noise amplifier; and
an inductive element coupled between the second main current terminal of the transistor and a ground node.

18. The RF probe of claim 17, wherein the low noise amplifier further comprises:
a first impedance matching circuit coupled between an input node of the low noise amplifier and the gate terminal of the transistor; and
a second impedance matching circuit coupled between the first main current terminal of the transistor and the output node.

19. The RF probe of claim 16, wherein the at least one variable component comprises a variable resistor and/or a variable capacitor and/or a variable inductor, or any combination of the above.

20. The RF probe of claim 16, wherein the variable impedance device further comprises a control block configured to control the at least one variable component based on a selection signal that indicates an output impedance value to be programmed.

21. The RF probe of claim 16, wherein the passive tuner comprises a variable resistor, a variable capacitor, and an inductor of fixed inductance coupled in series between the low noise amplifier and the at least one probe pin.

22. A system for device characterization, the system comprising:
a location configured to receive an integrated circuit that includes a device under test;
an RF (radio frequency) probe comprising a variable impedance device comprising a passive tuner comprising at least one variable component controllable to apply a variable impedance value to an input signal of the passive tuner, and a low noise amplifier configured to supply the input signal to the passive tuner by amplifying an input RF signal, the RF probe configured to be coupled to the integrated circuit to supply the RF input signal at a plurality of impedance values to at least one input of the device under test; and
a further RF probe configured to be coupled to the integrated circuit to receive an output signal from the device under test, the further RF probe comprising noise extraction circuitry coupled to the device under test and configured to determine, based on the output signal, a noise figure and/or noise factor of the device under test.

23. The system of claim 22, further comprising the integrated circuit disposed at the location.

24. The system of claim 22, wherein the low noise amplifier comprises:
a transistor having a gate terminal coupled to receive the RF input signal, and first and second main current terminals, the first main current terminal being coupled to an output node of the low noise amplifier; and
an inductive element coupled between the second main current terminal of the transistor and a ground node.

25. The system of claim 24, wherein the low noise amplifier further comprises:
a first impedance matching circuit coupled between an input node of the low noise amplifier and the gate terminal of the transistor; and
a second impedance matching circuit coupled between the first main current terminal of the transistor and the output node.

26. The system of claim 22, wherein the at least one variable component comprises a variable resistor and/or a variable capacitor and/or a variable inductor, or any combination of the above.

27. The system of claim 22, wherein the variable impedance device further comprises a control block configured to control the at least one variable component based on a selection signal that indicates an output impedance value to be programmed.

28. The system of claim 22, wherein the passive tuner comprises a variable resistor, a variable capacitor, and an inductor of fixed inductance coupled in series between the low noise amplifier and the integrated circuit.

29. A method of operating a radio frequency (RF) device, the method comprising:
- receiving an RF input signal at a variable impedance device, the RF input signal having a frequency between 60 and 110 GHz, wherein the variable impedance device comprises a passive tuner comprising at least one variable component controllable to apply a variable impedance value to an input signal of the passive tuner, and a low noise amplifier configured to supply the input signal to the passive tuner by amplifying the RF input signal;
- providing the RF input signal through the passive tuner to a device under test;
- determining a noise figure of the device under test; and
- tuning the variable impedance value of the passive tuner based on the determined noise figure.

30. The variable impedance device of claim 1, wherein the variable capacitor comprises a plurality of capacitor elements, each capacitor element separately comprising a fixed capacitor coupled in series with a control switch to a ground terminal, wherein each control switch is configured to receive a control signal for switching.

* * * * *

UNITED STATES PATENT AND TRADEMARK OFFICE
CERTIFICATE OF CORRECTION

| | |
|---|---|
| PATENT NO. | : 8,963,559 B2 |
| APPLICATION NO. | : 13/601904 |
| DATED | : February 24, 2015 |
| INVENTOR(S) | : Thomas Quemerais et al. |

It is certified that error appears in the above-identified patent and that said Letters Patent is hereby corrected as shown below:

On the Title Page, Item (73) Assignee, lines 2-3, delete "STMicorelectronics SA, Montrogue (FR)" and insert --STMicroelectronics SA, Montrouge (FR)--.

Signed and Sealed this
Eighth Day of March, 2016

Michelle K. Lee
*Director of the United States Patent and Trademark Office*